United States Patent [19]
Lee

[11] Patent Number: 6,057,213
[45] Date of Patent: May 2, 2000

[54] METHODS OF FORMING POLYCRYSTALLINE SEMICONDUCTOR LAYERS

[75] Inventor: Joo-hyung Lee, Seoul, Rep. of Korea

[73] Assignee: Samsung Electronics Co., Rep. of Korea

[21] Appl. No.: 09/026,538

[22] Filed: Feb. 19, 1998

[30] Foreign Application Priority Data

Feb. 19, 1997 [KR] Rep. of Korea .......................... 97-5053

[51] Int. Cl.$^7$ ................................................ H01L 21/265
[52] U.S. Cl. .......................... 438/486; 438/479; 438/487; 117/8
[58] Field of Search ..................... 438/479, 486, 438/487, FOR 155, FOR 158, FOR 169, FOR 206, FOR 393, FOR 269; 117/8

[56] References Cited

U.S. PATENT DOCUMENTS

| | | |
|---|---|---|
| 4,292,091 | 9/1981 | Togei . |
| 4,654,958 | 4/1987 | Baerg et al. . |
| 4,904,611 | 2/1990 | Chiang et al. . |
| 4,933,298 | 6/1990 | Hawegawa . |
| 5,318,919 | 6/1994 | Noguchi et al. . |
| 5,393,682 | 2/1995 | Liu . |
| 5,459,089 | 10/1995 | Baliga . |
| 5,529,951 | 6/1996 | Noguchi et al. . |
| 5,543,348 | 8/1996 | Hammerl et al. . |
| 5,614,428 | 3/1997 | Kapoor . |
| 5,652,156 | 7/1997 | Liao et al. . |

FOREIGN PATENT DOCUMENTS

| | | |
|---|---|---|
| 61-078119 | 4/1986 | Japan . |
| 61-131413 | 6/1986 | Japan . |

Primary Examiner—George Fourson
Assistant Examiner—Joannie A. Garcia
Attorney, Agent, or Firm—Myers Bigel Sibley & Sajovec

[57] ABSTRACT

Methods of forming polycrystalline semiconductor layers include the steps of forming a first polycrystalline semiconductor layer on a first amorphous semiconductor layer. The first polycrystalline semiconductor layer is then converted to a second amorphous semiconductor layer. At least a portion of the second amorphous semiconductor layer is then converted to a second polycrystalline semiconductor layer. In particular, relatively large size crystal grains may be produced in a semiconductor layer by converting the second amorphous semiconductor layer and at least a portion of the first amorphous semiconductor layer to a second polycrystalline semiconductor layer.

20 Claims, 3 Drawing Sheets

METHODS OF FORMING POLYCRYSTALLINE SEMICONDUCTOR LAYERS

FIELD OF THE INVENTION

The present invention relates to methods of forming semiconductor layers and more particularly, methods of forming polycrystalline semiconductor layers.

BACKGROUND OF THE INVENTION

A Liquid Crystal Display (LCD) may be used to display information using an electric field to control the arrangement of molecules within the liquid crystal. In particular, Thin Film Transistors (TFTs) may be used as switches for the electric field and thereby control the display of information on the LCD. TFTs may be fabricated by forming a polycrystalline semiconductor layer from an amorphous semiconductor layer formed on a substrate. In particular, TFTs may be fabricated using seed selection through ion channeling (SSIC).

FIGS. 1–3 show a method of fabricating a polycrystalline semiconductor layer according to the prior art. Referring to FIG. 1, an insulating layer 15, such as an oxide layer, is formed on a substrate 10, to a predetermined thickness. A polycrystalline semiconductor layer 20a is formed on the insulating layer 15 at a predetermined temperature to a predetermined thickness. For polysilicon the predetermined temperature may be about 630° C. and the predetermined thickness may be about 800 Å.

Referring to FIG. 2, ions may be implanted into the polycrystalline semiconductor layer 20a to form an amorphous semiconductor layer 20b (e.g., for polysilicon, Silicon ions (Si+) may be implanted). The ion implantation step may be performed at a predetermined energy and dosage level. For example, implantation of silicon ions into polysilicon may be performed at 50 KeV and at a dosage in a range between about $1.4 \times 10^{15}$ to about $2.0 \times 10^{15}$ ions/cm$^2$. The ion implantation may break some of the crystals within the polycrystalline semiconductor layer 20a and cause the polycrystalline semiconductor layer to become amorphous, wherein some crystals may remain to act as seeds for re-crystallization.

Referring to FIG. 3, the amorphous semiconductor layer 20b may be annealed at a predetermined temperature for a predetermined time (e.g., amorphous silicon may be annealed at a temperature in a range of about 600° C. for about 48 hours). The annealing step may cause the seeds in the amorphous semiconductor layer 20b and at the interface between the insulating layer 15 and the amorphous semiconductor layer 20b to re-crystallize into the polycrystalline semiconductor layer 20c. In the case of polysilicon, the grain size of the re-grown crystals may be about 0.5 µm so that the electrons therein have a mobility of about 80 m$^2$/Vs. Accordingly, the crystals re-grown from those seeds may be relatively small since crystallization occurs within the amorphous semiconductor layer 20b and at the interface between the amorphous semiconductor layer 20b and the insulating layer 15 (i.e., crystal growth occurs in two directions within the amorphous semiconductor layer 20b).

The size, defect density, and surface roughness of the formed polycrystalline semiconductor layer 20c may influence the performance of the TFT. In particular, polycrystalline semiconductors with a relatively small grain size, high defect density, or a relatively rough surface may exhibit higher resistivity, decreased field effect capability, and contribute to charge carrier scattering.

The ion dosage may be increased to reduce the number of seeds in the amorphous semiconductor layer and thereby increase the grain size. However, when the ion dosage is increased, the annealing time for growing relatively large crystals may increase substantially. For example, FIG. 4 illustrates graphs of maximum grain size versus annealing time at various silicon ion dose levels. In particular, to produce a polysilicon layer having grains with average sizes greater than about 1.0 µm using a Si+ion dosage in a range between about $1.5 \times 10^{15}$ ion/cm$^2$ and about $5 \times 10^{15}$ cm$^2$, may require an annealing time of about 50 hours.

SUMMARY OF THE INVENTION

It is, therefore, an object of the present invention to provide methods of forming polycrystalline semiconductor layers having relatively large single crystal grains therein.

It is another object of the invention to reduce the annealing time for forming semiconductor layers with large single crystal grains therein.

These and other objects of the present invention are provided by methods of forming a first amorphous semiconductor layer on an insulating substrate and then forming a first polycrystalline semiconductor layer on the first amorphous semiconductor layer. The first polycrystalline semiconductor layer is then converted to a second amorphous semiconductor layer using an ion implantation step. The second amorphous semiconductor layer is then converted back into a preferred second polycrystalline semiconductor layer which is suitable as a TFT display material.

In one embodiment of the present invention, relatively large size crystal grains may be produced in a semiconductor layer by converting the second amorphous semiconductor layer and at least a portion of the first amorphous semiconductor layer to a second polycrystalline semiconductor layer. This conversion step may be performed by annealing the second amorphous semiconductor layer at a temperature in a range between about 580° C. and 650° C. The ion implantation step may also be performed by implanting ions at a dose in a range between about $5.0 \times 10^{14}$ and about $8.0 \times 10^{14}$ ions/cm$^2$ and an energy level in a range between about 50 and about 90 keV. Using these preferred steps, crystal growth from seeds within the second amorphous layer may proceed in a uniform direction through the second and first amorphous semiconductor layers. In particular, these preferred steps may be used to form a final polycrystalline semiconductor layer which contains grains therein having an average grain size greater than about 0.7 µm. Accordingly, the methods of the present invention may be used to form polycrystalline semiconductor layers having large grains therein, low surface roughness and low defect density.

DETAILED DESCRIPTION OF THE INVENTION

Figure 1:
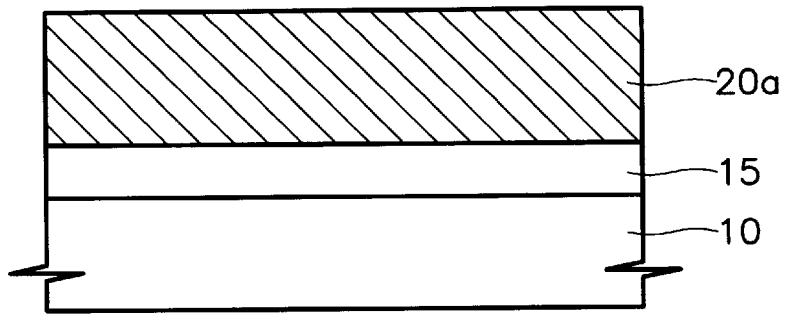
FIGS. 1–3 are cross sectional views of intermediate structures which illustrate methods of forming a polycrystalline silicon layer according to the prior art.
Figure 2:
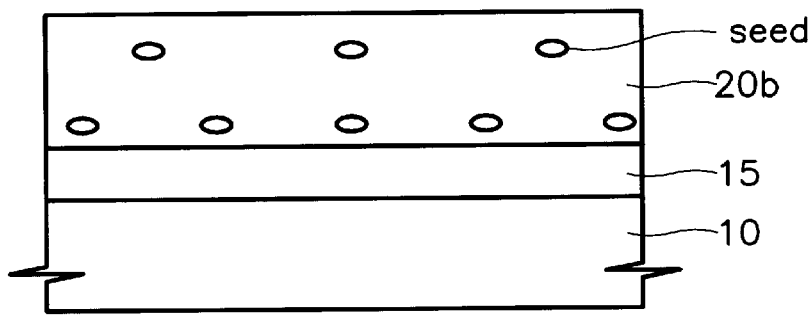
Figure 3:
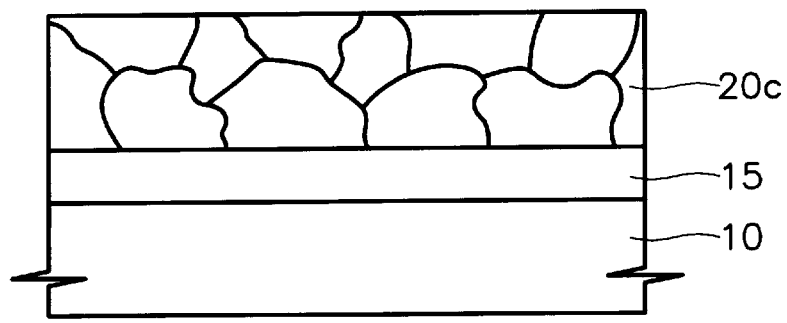
Figure 4:
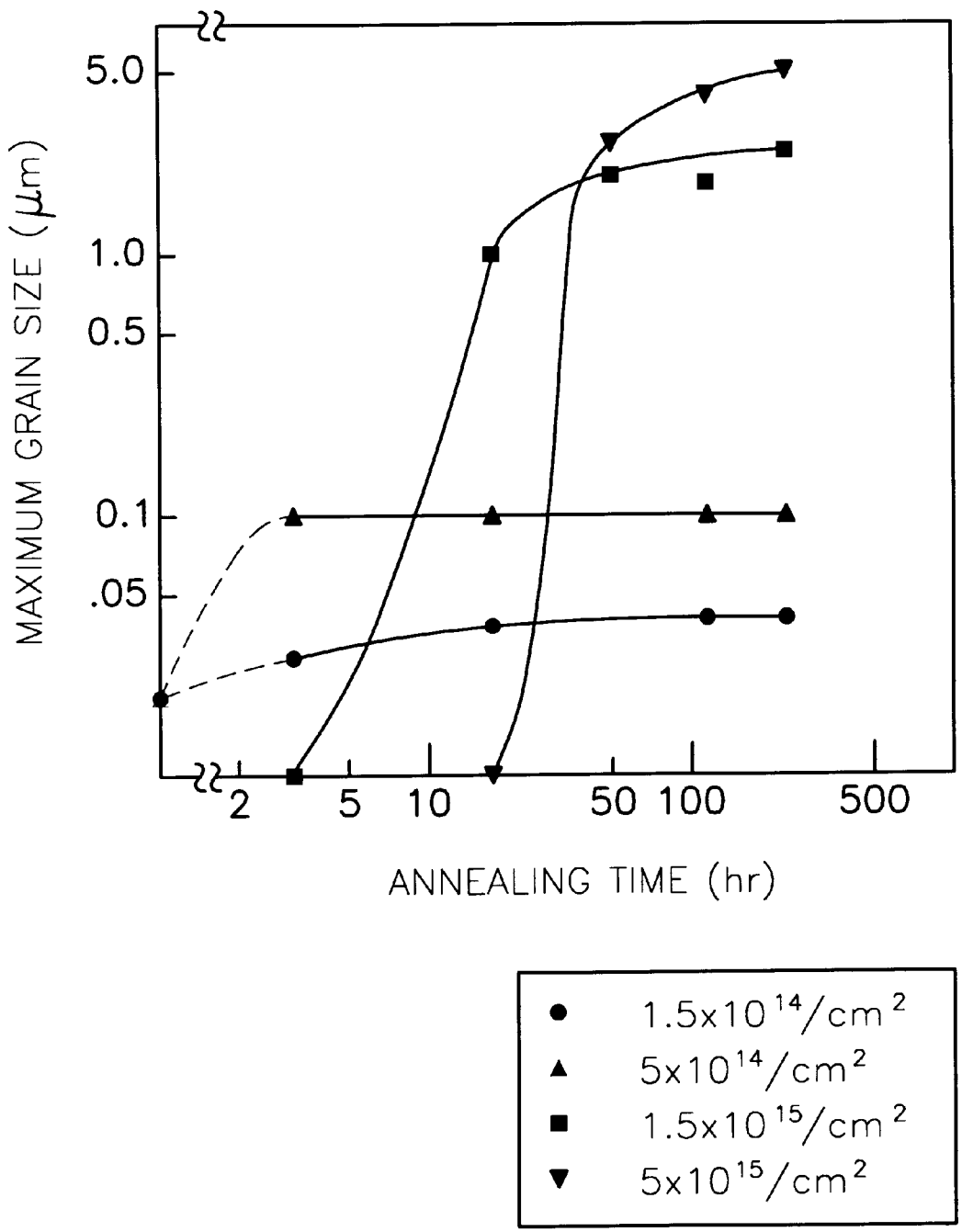
FIG. 4 illustrates graphs of maximum grain size versus annealing time when converting an amorphous silicon layer to polycrystalline silicon according to the prior art.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 5:
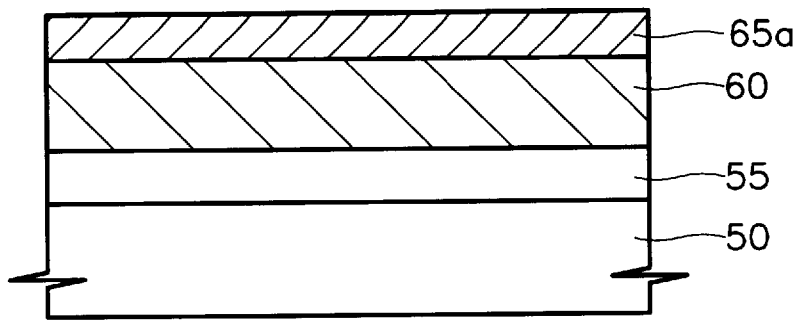
FIGS. 5–7 are cross sectional views of intermediate structures which illustrate methods of forming polycrystalline silicon layers according to an embodiment of the present invention.
Figure 6:
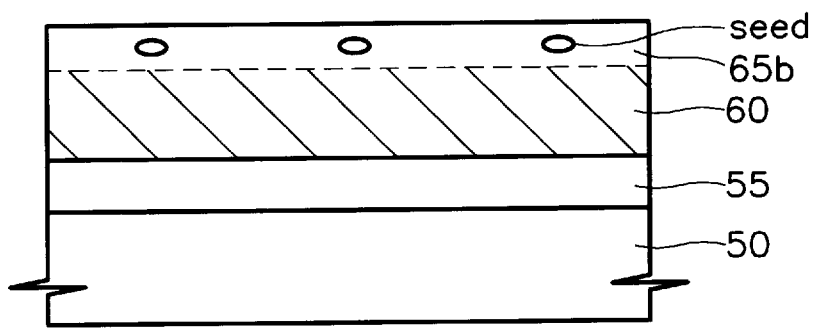
Figure 7:
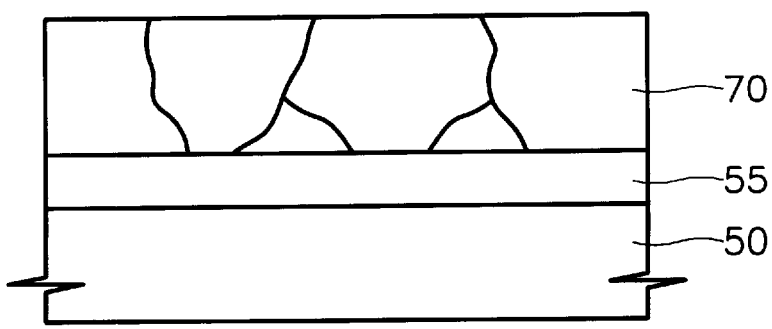

Referring now to FIGS. 5–7, preferred methods of forming polycrystalline semiconductor layers will be described. In particular, as best illustrated by FIG. 5, an insulating layer 55, such as an oxide layer, is formed to a predetermined thickness on a substrate 50 (e.g., semiconductor substrate). An amorphous silicon layer 60 is deposited on the insulating layer 55 at a temperature in a range between about 420° and about 550° C. and to a thickness in a range between about 300 Å and about 800 Å. The amorphous silicon layer 60 may be deficient of seeds. In a preferred embodiment, the thickness of the amorphous silicon layer 60 may be formed to have a thickness of about 500 Å using a low pressure chemical vapor deposition (LPCVD) step.

The temperature of the LPCVD chamber in which the deposition step is performed may be increased to a temperature in a range between about 550° C. and about 650° C. after the first amorphous silicon layer 60 has been formed. A polysilicon layer 65a is then formed to a thickness in a range between about 100 Å and about 500 Å. In the preferred embodiment, the polysilicon layer 65a is formed to a thickness of about 300 Å. A constant vacuum may be maintained while the first amorphous silicon layer 60 and the first polysilicon layer 65a are deposited. Some additional crystals may be produced during the deposition of the first polysilicon layer 65a. The additional crystals, however, may be broken during the subsequent implantation of silicon ions (Si$^+$) as explained below.

Referring now to FIG. 6, silicon ions (Si$^+$) are implanted into the first polysilicon layer 65a to form a second amorphous silicon layer 65b. The ion implantation step is preferably performed at an energy in a range between about 50 KeV and about 90 KeV, and at a dosage in a range between about $5.0 \times 10^{14}$ ions/cm$^2$ and about $8.0 \times 10^{14}$ ions/cm$^2$. The silicon ions (Si$^+$) may be implanted at a tilt angle in a range between about 0° and about 7° relative to the surface of the first polysilicon layer 65a. By performing the ion implantation step at a preferred tilt angle, single crystal seeds can be formed to have uniform orientation relative to each other as described below. The ion implantation step is performed so that substantially all of the single-crystal grains within the first polysilicon layer 65a are made amorphous (i.e., amorphized). Some single-crystal grains, however, may remain in the formed second amorphous silicon layer 65b after the ion implantation step. The remaining grains preferably provide seeds for the subsequent crystallization of the second amorphous silicon layer 65b and the first amorphous silicon layer 60. As determined by the inventor herein, the angle of ion implantation may be adjusted so that a preferred crystallographic orientation of any remaining single-crystal seeds within the second amorphous silicon layer 65b layer can be achieved. Moreover, the electrically inactive ions can be implanted at a preferred tilt angle so that the single crystal seeds remaining in the second amorphous silicon layer 65b have a desired crystallographic orientation which promotes the formation of uniform and large grains during a subsequent crystallization step.

Referring now to FIG. 7, the second amorphous silicon layer 65b and the first amorphous silicon layer 60 layers are annealed at a temperature in a range between about 580° C. and about 650° C. for a period in a range between about 48 hours and about 120 hours to thereby crystallize the second amorphous silicon layer 65b and the first amorphous silicon layer 60 and form a second polysilicon layer 70. During the annealing steps, the seeds in the second amorphous silicon layer 65b are crystallized. However, in the prior art, seeds may form at the interface between the oxide layer 15 and the polysilicon layer 20b as well as in the polysilicon layer 20b. Consequently, in the prior art, crystallization may occur in two or more directions and produce relatively small and uneven crystals. In a system utilizing the present invention, however, the seeds may form only in the second amorphous silicon layer, thereby causing crystallization in one direction so as to produce a polysilicon layer having relatively large and even grains.

Although the present invention is described with respect to an embodiment using silicon, it should be understood that the invention may also be practiced using other semiconductor materials. The ranges and predetermined values used herein may be adjusted by those skilled in the art to correspond to embodiments using other semiconductor materials.

In the drawings and specification, there have been disclosed typical preferred embodiments of the invention and, although specific terms are employed, they are used in a generic and descriptive sense only and not for the purposes of limitation, the scope of the invention being set forth in the following claims.

That which is claimed is:

1. A method of forming a polycrystalline semiconductor layer, comprising the steps of:

forming a first amorphous semiconductor layer;

forming a first polycrystalline semiconductor layer on the first amorphous semiconductor layer;

converting the first polycrystalline semiconductor layer to a second amorphous semiconductor layer; and converting at least a portion of the second amorphous semiconductor layer to a second polycrystalline semiconductor layer.

2. The method of claim 1, wherein said step of converting at least a portion of the second amorphous semiconductor layer to a second polycrystalline semiconductor layer comprises converting the second amorphous semiconductor layer and at least a portion of the first amorphous semiconductor layer to a second polycrystalline semiconductor layer.

3. The method of claim 1, wherein said step of forming a first amorphous semiconductor layer comprises forming a first amorphous semiconductor layer on an electrically insulating substrate; and wherein said step of forming a first polycrystalline semiconductor layer comprises forming a first polycrystalline semiconductor layer in contact with a surface of the first amorphous semiconductor layer extending opposite the electrically insulating substrate.

4. The method of claim 2, wherein said step of converting the first polycrystalline semiconductor layer to a second amorphous semiconductor layer comprises implanting ions into the first polycrystalline semiconductor layer.

5. The method of claim 4, wherein said step of implanting ions comprises implanting ions which are electrically inactive in the first polycrystalline semiconductor layer.

6. The method of claim 5, wherein said step of implanting ions comprises implanting ions selected from the group consisting of Si, He, Ne, H and Ar.

7. The method of claim 4, wherein said step of forming a first polycrystalline semiconductor layer comprises forming a first polycrystalline silicon layer having a thickness greater than about 100 Å, on the first amorphous semiconductor layer; and wherein said step of implanting ions comprises implanting ions at a dose in a range between about $5.0 \times 10^{14}$ and about $8.0 \times 10^{14}$ ions/cm$^2$ and an energy level in a range between about 50 and about 90 keV.

8. The method of claim 3, wherein said step of converting at least a portion of the second amorphous semiconductor layer to a second polycrystalline semiconductor layer comprises annealing the second amorphous semiconductor layer at a temperature in a range from between about 580° C. and about 650° C. for a duration of no less than about 48 hours.

9. The method of claim 3, wherein said step of converting at least a portion of the second amorphous semiconductor layer to a second polycrystalline semiconductor layer comprises laser annealing the second amorphous semiconductor layer.

10. The method of claim 4, wherein said step of implanting electrically inactive ions into the first polycrystalline semiconductor layer comprises implanting electrically inactive ions into the first polycrystalline semiconductor layer, wherein the electrically inactive ions are implanted at a tilt angle in the range between about 0° and about 7°.

11. A method of forming a polysilicon layer, comprising the steps of:

forming an insulating layer;

forming a first amorphous silicon layer on the insulating layer;

forming a first polysilicon layer on the first amorphous silicon layer;

converting the first polysilicon layer to a second amorphous silicon layer; and crystallizing a portion of the first and second amorphous silicon layers to a second polysilicon layer.

12. The method of claim 11, wherein said step of forming a first amorphous silicon layer on the insulating layer comprises depositing a first amorphous silicon layer at a temperature in a range between about 420° C. and about 550° C., on the insulating layer.

13. The method of claim 1, wherein said step of forming a first amorphous silicon layer on the insulating layer comprises forming a first amorphous silicon layer having a thickness in a range between about 300 Å and about 800 Å, on the insulating layer.

14. The method of claim 11, wherein said step of forming a first polysilicon layer on the first amorphous silicon layer comprises depositing a first polysilicon layer at a temperature in a range between about 550° C. and about 650° C., on the first amorphous silicon layer.

15. The method of claim 11, wherein said step of forming a first polysilicon layer on the first amorphous silicon layer comprises forming a first polysilicon layer having a thickness in a range between about 100 Å and about 500 Å, on the first amorphous silicon layer.

16. The method of claim 11, wherein said step of forming a first polysilicon layer on the first amorphous silicon layer comprises forming a first polysilicon layer on the first amorphous silicon layer, wherein the first polysilicon layer is formed without a vacuum break after forming the first amorphous silicon layer.

17. The method of claim 15, wherein said step of converting the first polysilicon layer to a second amorphous silicon layer comprises the step of implanting electrically inactive Si ions into the first polysilicon layer.

18. The method of claim 17, wherein said step of implanting electrically inactive Si ions into the first polysilicon layer comprises implanting electrically inactive Si ions at an energy in a range between about 50 KeV and about 90 KeV, and a dose in a range between about $5.0 \times 10^{14}$ ions/cm$^2$ and about $8.0 \times 10^{14}$ ions/cm$^2$.

19. The method of claim 17, wherein said step of implanting electrically inactive Si ions into the first polysilicon layer comprises implanting electrically inactive Si ions into the second amorphous silicon layer at a tilt angle in a range between about 0° and 7° relative to a normal to the surface of the second polysilicon layer.

20. A method of forming a polycrystalline semiconductor layer, comprising the steps of:

forming a first amorphous semiconductor layer;

forming a first polycrystalline semiconductor layer on the first amorphous semiconductor layer;

converting the first polycrystalline semiconductor layer to a second amorphous semiconductor layer; and converting at least a portion of one of the first and second amorphous semiconductor layers to a second polycrystalline semiconductor layer.

* * * * *